United States Patent
Woods et al.

(10) Patent No.: US 7,262,597 B2
(45) Date of Patent: Aug. 28, 2007

(54) HYBRID SQUID MICROSCOPE WITH MAGNETIC FLUX-GUIDE FOR HIGH RESOLUTION MAGNETIC AND CURRENT IMAGING BY DIRECT MAGNETIC FIELD SENSING

(75) Inventors: Solomon I. Woods, Kensington, MD (US); Lee A. Knauss, Bowie, MD (US); Nesco M. Lettsome, Beltsville, MD (US); Alfred B. Cawthorne, Beltsville, MD (US); Thirumalai Venkatesan, Washington, DC (US)

(73) Assignee: Neocera, LLC, Beltsville, MD (US)

( * ) Notice: Subject to any disclaimer, the term of this patent is extended or adjusted under 35 U.S.C. 154(b) by 19 days.

(21) Appl. No.: 10/940,717

(22) Filed: Sep. 15, 2004

(65) Prior Publication Data

US 2005/0057248 A1    Mar. 17, 2005

Related U.S. Application Data

(60) Provisional application No. 60/502,629, filed on Sep. 15, 2003.

(51) Int. Cl.
*G01R 33/035* (2006.01)
*G01R 33/12* (2006.01)

(52) U.S. Cl. ..................... 324/248; 324/262; 505/845; 505/846

(58) Field of Classification Search ................ 324/248, 324/260, 262; 505/162, 845, 846; 600/409; 250/306

See application file for complete search history.

(56) References Cited

U.S. PATENT DOCUMENTS 5,523,686 A * 6/1996 Kirtley et al. ............... 324/248
5,894,220 A * 4/1999 Wellstood et al. .......... 324/248
5,900,729 A * 5/1999 Moser et al. ............... 324/244
6,211,673 B1 * 4/2001 Gerber et al. ............... 324/262
6,320,369 B1 * 11/2001 Hidaka et al. .......... 324/117 R
6,344,742 B1 * 2/2002 Kobayashi et al. ......... 324/248
6,603,308 B2 * 8/2003 Itozaki et al. ............... 324/248
6,784,663 B2 * 8/2004 Sarwinski et al. .......... 324/248
6,828,786 B2 * 12/2004 Scherer et al. .............. 324/300
6,972,562 B1 * 12/2005 Vlasko-Vlasov et al. .. 324/244.1
2005/0057246 A1 * 3/2005 Orozco et al. .............. 324/228
2005/0104585 A1 * 5/2005 Bilik et al. ................. 324/240

FOREIGN PATENT DOCUMENTS

DE        19519480 A1 *    5/1995
WO    WO 2004079384 A1 *  9/2004

* cited by examiner

*Primary Examiner*—Jay M Patidar
(74) *Attorney, Agent, or Firm*—Rosenberg, Klein & Lee

(57) ABSTRACT

A scanning microscope for high resolution current imaging by direct magnetic field sensing of a sample maintained in an ambient environment. The scanning microscope uses a magnetic sensor such as a SQUID and a fiber probe magnetically coupled between the SQUID sensor and the sample under study. The fiber probe has a sharply defined tip for high resolution probing and for reaching minute cavities on the surface of the sample. The coupling between the tip of the fiber probe and the sample is controlled by a distance control mechanism, in the range of 1-100 nm. The material of the fiber probe with high permeability and low magnetic noise is chosen to optimize flux transmission to the magnetic sensor. Magnetic coupling to the sensor is maximized by keeping the distance between the end of the fiber probe and the sensor to approximately 0-100 μm. The fiber probe is integrated into the fiber holder for easy replacement of the fiber probe.

40 Claims, 8 Drawing Sheets

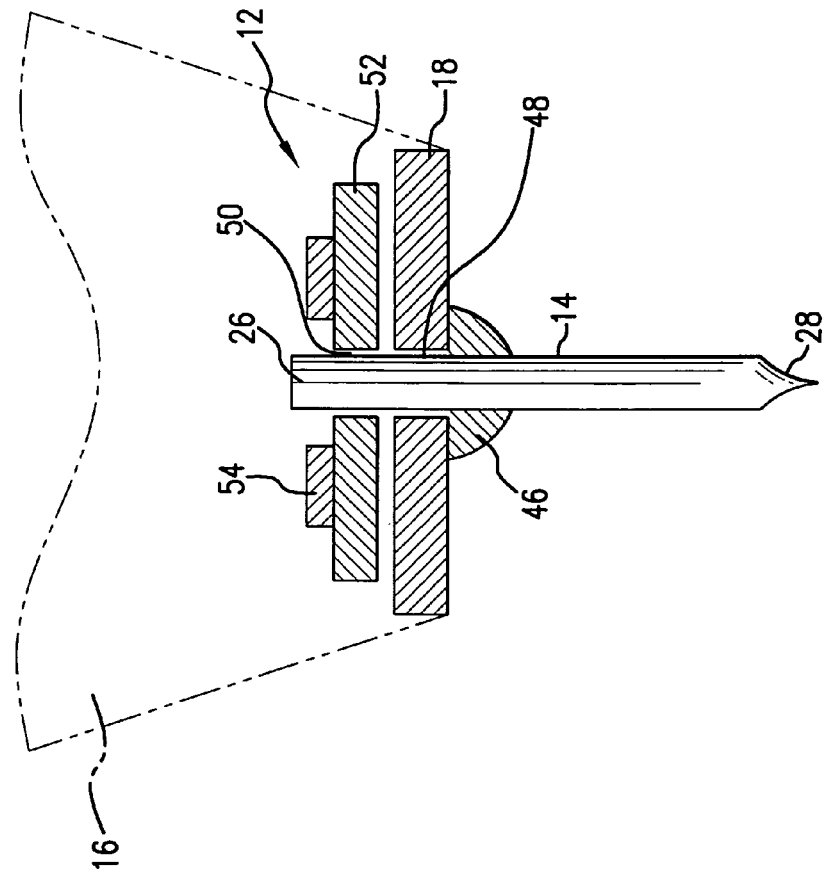
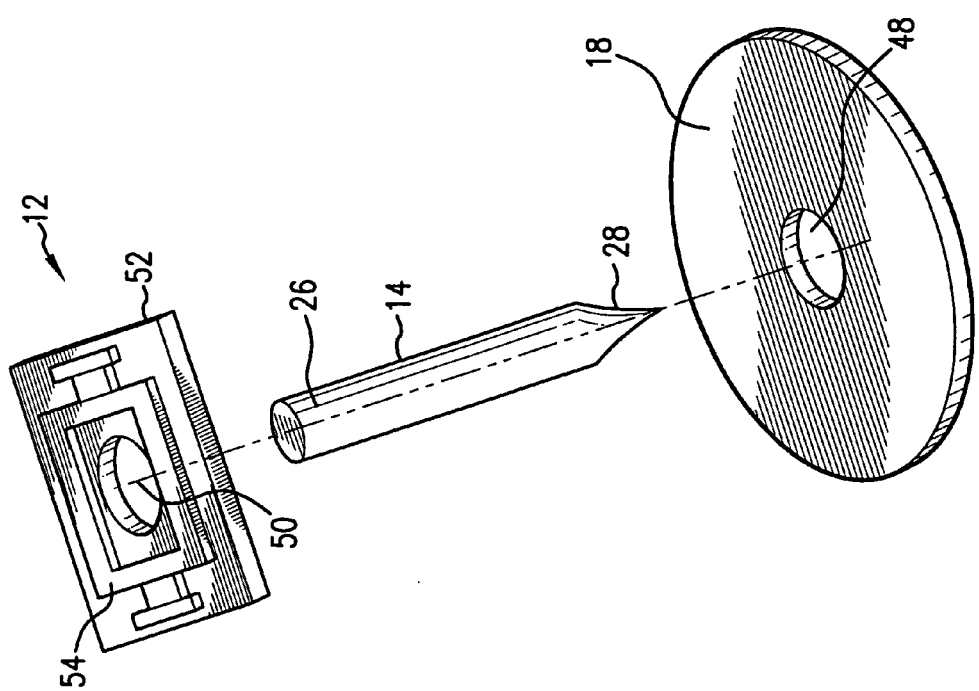

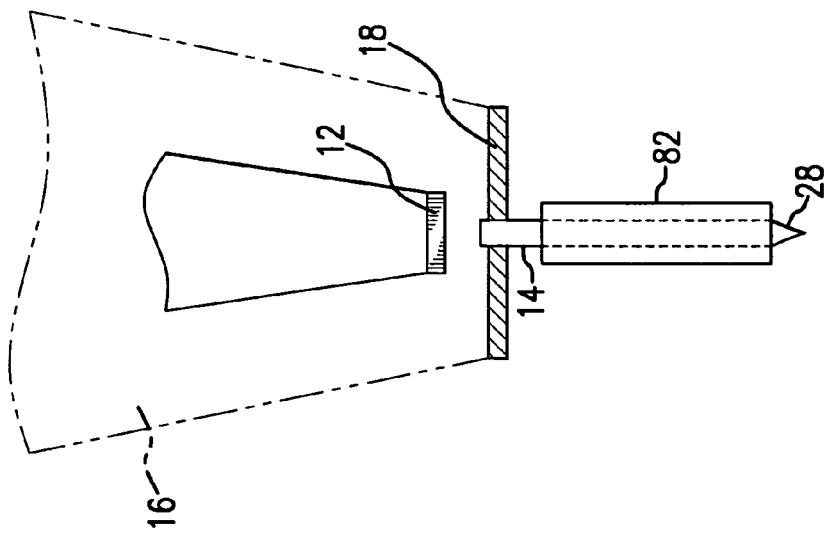
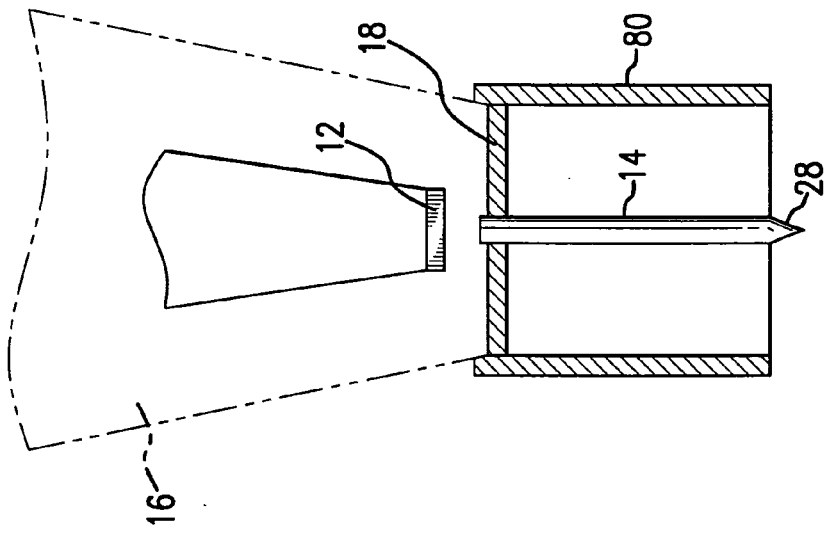
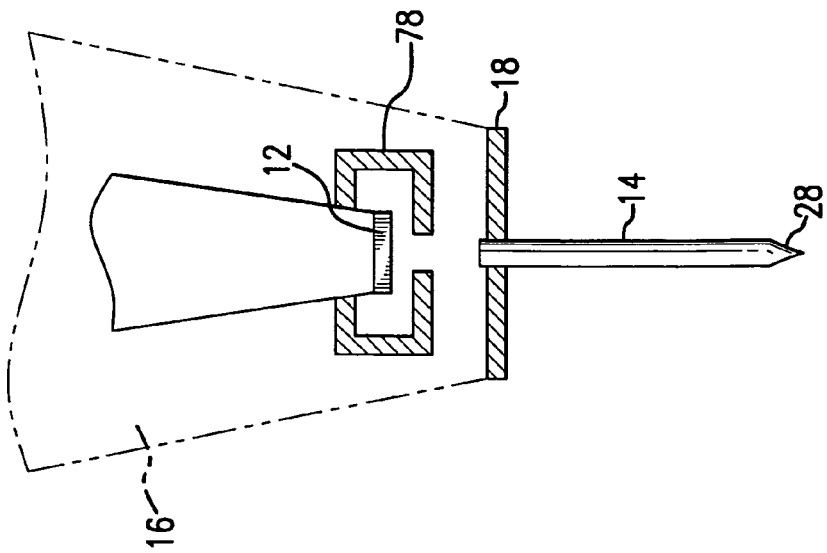

HYBRID SQUID MICROSCOPE WITH MAGNETIC FLUX-GUIDE FOR HIGH RESOLUTION MAGNETIC AND CURRENT IMAGING BY DIRECT MAGNETIC FIELD SENSING

This Utility Patent Application is based on the Provisional Patent Application No. 60/502,629, filed 15 Sep. 2003.

FIELD OF THE INVENTION

The present invention relates to current imaging; and more particularly to current imaging by direct magnetic field sensing.

In overall concept thereof, the present invention relates to magnetic microscopy in which a highly sensitive magnetic sensor, such as for example Superconducting Quantum Interference Device (SQUID) measures magnetic flux emanating from a sample under study which is probed by a fiber probe magnetically coupled to the SQUID.

Further, the present invention relates to a magnetic microscope which includes a magnetic sensor, such as a SQUID which is positioned in a vacuum environment having a fiber probe extending between the SQUID and the sample. The sample is positioned in an ambient or air environment at substantially room temperature. The high sensitivity of the SQUID sensor is combined with the high resolution permitted by the use of the fiber probe. The fiber probe has a sharply defined and polished tip on the probing end thereof.

Further, the present invention relates to a magnetic microscopy method and system which combines a SQUID sensor and a fiber probe magnetically coupled thereto wherein the sharply defined tip of the fiber probe is capable of probing the magnetic flux emanating from the sample with high resolution in areas of the sample unreachable otherwise such as for example, minute cavities formed within the surface of the sample.

The present invention is additionally directed to a method of direct magnetic field sensing for high resolution current imaging in which the sample is scanned under the magnetic microscope which includes a SQUID and the fiber probe magnetically coupled thereto to pick up the magnetic flux from the sample. This channels the sensed magnetic flux from the sample to the SQUID and measures the disturbances from the fiber probe at the SQUID. In such a microscope, having optimized transmission from the tip of the fiber probe to the SQUID, high magnetic sensitivity and sub-micron resolution is obtained by using the highly sensitive SQUID, by optimizing the transmitting properties of the fiber probe, through sharpening of the tip of the fiber probe to nanometer ranges, by minimizing distance between the SQUID and the end of the fiber probe to below 100 μm and further by maintaining the magnetic coupling between the fiber probe and the sample in sub-micron range distances. The sub-micron distance between the tip of the fiber probe and the sample is controlled by several mechanisms including for example a shear force mechanism.

BACKGROUND OF THE INVENTION

Magnetic sensors provide a promising route to realize nanoscale current imaging in the next generation integrated circuits. The semiconductor industry has been consistently reducing the size of transistors, reducing the size and adding more interconnect metallization, and using a variety of packaging technologies to accommodate the increased circuit density with the resultant heat dissipation without compromising signal delay times.

The increased level of metal interconnect required for the increasing number of transistors, limits thermal and optical techniques commonly used today for fault isolation. Complex devices being developed have six levels of metal, and many companies manufacture electronic devices with 8-10 levels of metal.

Optical and thermal techniques commonly used for fault isolation in the integrated circuits are ineffective beyond three levels of the metal layerization. Further complicating die level analysis are current trends in packaging technology. Flip-chip packaging requires that non-destructive measurements be made through the silicon substrate. Stacked die packaging may require that measurement be made through multiple die and packaging layers having a variety of materials. The package substrates for the new integrated circuits are also becoming more complex with finer line dimension approaching 10 nm and many layers of metallization (as high as ten layers), often having several ground and power planes that complicate non-destructive analysis.

Any non-destructive analysis technique must be able to look or be operative through many layers of metallization and packaging materials in order to sense defects in the deeper layers. In the extreme case of stacked die packaging, means of imaging at depths in the range of millimeters is required. These trends have produced a clear need for failure analysis that would enable the localization of buried nanoscale and non-visual defects with a resolution below 500 nm and sensitivity to detect currents as low as 50 nA. Hence, novel probes with extreme current sensitivity and spatial resolution that can image buried layers are needed. Without this capability, the development of new circuits and analysis of failures in semiconductor devices will be greatly hampered, limiting the semiconductor industry in its ability to bring advanced devices quickly to commercialization.

Scanning SQUID (Superconducting Quantum Interference Device) microscopy has proven that magnetic field sensitive probes can be powerful tools for imaging current flow in electronic devices. Through its extraordinary sensitivity to magnetic fields, SQUID sensors are able to detect small currents even if they are buried hundreds of microns below a sample surface. Scanning SQUID microscopy has become a mainstream tool for package-level fault isolation and an effective tool for die-level fault isolation. This technology has been driven by the need for tools to non-destructively isolate defects through complex packaging-like flip-chip multichip modules and stacked die packaging through ever-increasing numbers of metal layers in state-of-the-art die.

As more semiconductor manufacturing companies have begun to use SQUID microscopy, advancing technological development is required in two areas. In the packaging domain, SQUID microscopy has been very successful at localizing electrical shorts and high resistance defects. In the die domain, the ever-shrinking geometries of the microstructures require development of higher resolution capability. The spatial resolution of the scanning SQUID microscope, however, has historically been limited to lengths greater than several microns, since it is difficult to fabricate functioning SQUIDs with dimensions smaller than the necessary scale.

Magnetic sensors, even in micron scale are generally fabricated on macroscopic substrates, at least hundreds of microns on a side, not allowing these magnetic probes to reach within a few microns of current lines in most powered and packaged devices. In front side scanning this large probe size does not permit the scanning of lines near powering probes or wire bonds. In back side scanning it does not permit fitting within etched cavities made to expose buried layers as illustrated in FIG. 1. The physical limitations of current magnetic sensors in applications to non-destructive failure analysis in the semiconductor devices is that the spatial resolution is roughly limited to sizes larger than one-fifth of the separation between the sensor and the current source. Present day magnetic sensors cannot be located near enough to many structures in powered and packaged devices to image nanoscale, microAmp-level currents. Since SQUIDs smaller than 1 µm on a side have not been successfully fabricated, the direct nanoscale imaging using these sensors is not likely, since the spatial resolution is also roughly limited to sizes larger than the sensor size.

Another limitation in the application of the magnetic sensors to destructive failure analysis is that the spatial separation between the SQUID, which must be maintained in a cryogenic environment, and the sample, which is in air at room temperature, must be at least 10 µm to relieve the thermal gradient and contain the SQUID in its environment (generally vacuum or liquid nitrogen), making direct nanoscale imaging using the standard SQUID sensors an unlikely prospect.

It is therefore desirable to provide a non-destructive failure analysis tool using the existing highly sensitive magnetic sensors where the important resolution limitations associated with the present day magnetic sensors is overcome to achieve high sensitivity nanoscale current imaging of a large range of packaged microelectronic devices.

SUMMARY OF THE INVENTION

It is therefore an object of the present invention to provide a tool for non-destructive analysis of buried nanoscale and non-visual defects in semiconductor devices by fiber based high sensitivity magnetic probes which will have a form factor capable of imaging inside small cavities and capable of nanoscale resolution with current sensitivity of 10 nA.

It is another object of the present invention to provide a scanning microscope based on sensitive magnetic sensors for current imaging by direct magnetic field sensing capable of the high resolution and nanoscale current imaging of the sample at room temperature and in an air environment.

It is a further object of the present invention to provide a fiber-SQUID scanning microscope for non-destructive failure analysis in integrated circuits where the magnetic sensor (SQUID) is closely coupled to a ferromagnetic probe wire which is etched to a tip of a sub-micron diameter to permit nanoscale imaging wherein the dimensions of the SQUID are not critical since it does not function as the sample probe.

It is still another object of the present invention to provide a scanning SQUID microscope containing a SQUID and a fiber probe formed of a ferromagnetic material with high permittivity for channeling magnetic flux picked up by the tip of the fiber probe from the sample. In such a microscope, the SQUID is kept in a vacuum cryogenic environment and can be separated from the sample which is kept generally at room temperatures. The scanning SQUID microscope permits the SQUID to be remote from the sample while permitting the close magnetic coupling of the tip of the fiber probe to the sample with a distance less than 100 nm. Due to a sharply defined tip such a scanning SQUID microscope is able to reach buried and power circuits as well as allowing scanning near powering pads and within small area cavities.

The present invention also provides a system for high resolution current imaging by direct magnetic field sensing which includes a magnetic sensor positioned in a cryogenic vacuum environment while a sample is positioned in an air environment at room temperature. In the system as herein described, a fiber probe having a sharply defined tip is magnetically coupled to the magnetic sensor at a distal end thereof and coupled to the sample by a sharply defined tip at the opposite end. The tip of the fiber probes with the fine spatial resolution (in the range of 10-100 nm) is operably connected to the surface of the sample to pick up magnetic fields emanating therefrom. The fiber probe serves as a guide to channel magnetic flux from the sample to the magnetic sensor and the magnetic sensor detects the disturbances from the probe. A Superconducting Quantum Interference Device (SQUID) can be used as the magnetic sensor due to its high sensitivity to magnetic fields.

The SQUID is immersed into the vacuum or cryogenic (liquid nitrogen) environment which is maintained in a SQUID housing surrounding the SQUID and having a diamond window formed therein. The window and the housing separate the environment of the SQUID from the air environment in which the sample is positioned.

The high resolution of the system of the present invention is provided by sharply etching the tip of the fiber probe in the range of 10 nm-1 µm. The optimized transmission of the magnetic flux from the sample to the SQUID is attained by choosing the material of the fiber probe which may include a ferromagnetic metal material with high permeability. The fiber probe is subjected to current and/or temperature annealing to align weak magnetic domains in the material of the fiber probe. Additionally, the fiber probe is surface etched to reduce noise from surface defects.

For enhanced sensitivity, the coupling between the tip and the sample is maintained at the distance in the range of 1-100 nm, and the coupling between the distal end of the fiber probe and the SQUID is maintained in the range of 0-20 µm.

In order to maintain the specified distance between the fiber tip and the sample, a distance control, for example by a shear force feedback technique is used which allows fine control of the distance.

Several techniques of shielding from electromagnetic interference (EMI) may be used in the scanning SQUID microscope which include, for example, a µ-metal box around the SQUID with an opening for the fiber. Additionally, a µ-metal µtube may be provided which extends along the length of the fiber probe from the SQUID housing to the tip of the fiber probe. Alternatively, a shield made from µ-metal may be formed as a sheath for the fiber probe extending along the length of the fiber probe to the tip thereof.

The fiber probe may be integrated into a fiber holder for quick and an easily removable attachment to the SQUID housing.

There are several types of couplings between the fiber probe and the SQUID which are contemplated in the present invention. The distal end of the fiber probe may be directly glued or adhered to the window of the SQUID housing by epoxy or some like technique, and the distance between the distal end of the fiber probe and the SQUID may be varied by the motion of the SQUID housing relative to the SQUID. Alternatively, an opening may be formed in the window of the SQUID housing and the fiber probe may protrude through it and be secured within the opening with the distal end extending into the cryogenic environment within the SQUID housing.

In another alternative approach, the coupling between the fiber probe and the SQUID may be accomplished by fabricating a hole through the substrate of the SQUID in order that the distal end of the fiber probe protrudes through the hole in the center of the pickup coil of the SQUID. In this embodiment, the fiber probe is secured within the opening made in the window of the SQUID housing. A further alternative embodiment of the coupling between the fiber probe and the SQUID can be implemented by integrating a small fiber into the SQUID. The small fiber extends from the SQUID towards the window of the SQUID housing, and the external fiber probe is aligned with the integrated small fiber extending from the SQUID.

A DC-bias coil can be attached to the tip of the fiber probe to DC-bias the fiber probe to the point of the highest permeability thereof.

The present invention is also directed to a method for high resolution current imaging by direct magnetic field sensing which includes the steps of:

forming a magnetic microscope comprising a magnetic sensor and a fiber probe magnetically coupled at a distal end thereof to the magnetic sensor, installing a sample at an ambient (room) temperature in an air or non-vacuum environment, magnetically coupling the sharply defined tip formed at the end of the fiber probe to the sample, and scanning the magnetic microscope relative to the sample to probe magnetic fields emanating from the sample by the tip of the fiber probe.

In the method of the present invention, the magnetic sensor is positioned either in a vacuum environment or a cryogenic environment. The SQUID is separated and isolated from the ambient environment by a magnetic sensor housing with a window fabricated therein. Preferably, the magnetic sensor is a SQUID which has an extraordinarily high sensitivity to magnetic fields. Alternatively, a spin valve, magnetic tunnel junction or Hall effect sensor could be used.

The window of the housing may be patterned to form a recess centrally formed therein in which the SQUID is positioned to reduce the distance between the SQUID and the fiber probe.

The coupling between the tip of the fiber probe and the sample is controlled by a distance control mechanism which may include different approaches such as shear force mechanisms, capacitance mechanisms, atomic force methods, electron tunneling mechanisms, etc.

In order to optimize the transmission of a magnetic flux picked up at the sample emanating to the SQUID, the material of the fiber probe is chosen to be a metglas or a ferromagnetic metal with high permeability. To reduce noise associated with magnetic flux transmission, the fiber probe is subjected either to current annealing or temperature annealing. The surface noise effects are reduced by the surface etching of the fiber probe. Shielding to reduce EM interference may be used for the SQUID as well as for the fiber probe.

The method of the present invention also includes steps leading to different alternative forms of coupling between the distal end of the fiber probe and the SQUID.

The microscope may be operated in two modes: scanning with a bare SQUID, and scanning with the fiber probe. Different scanning routines are designed for operation of the novel microscope.

These features and advantages of the present invention will be fully understood and appreciated from the following detailed description of the invention in conjunction with the accompanying Drawings.

BRIEF DESCRIPTION OF THE DRAWINGS

FIGS. 4A and 4B show schematically another alternative embodiment of the coupling between the fiber probe and the SQUID where the fiber probe protrudes into the hole made in the substrate of the SQUID;

FIGS. 8A, 8B, and 8C show schematically different shielding techniques used in the microscope of the present invention;

DESCRIPTION OF THE PREFERRED EMBODIMENTS

Figure 1:
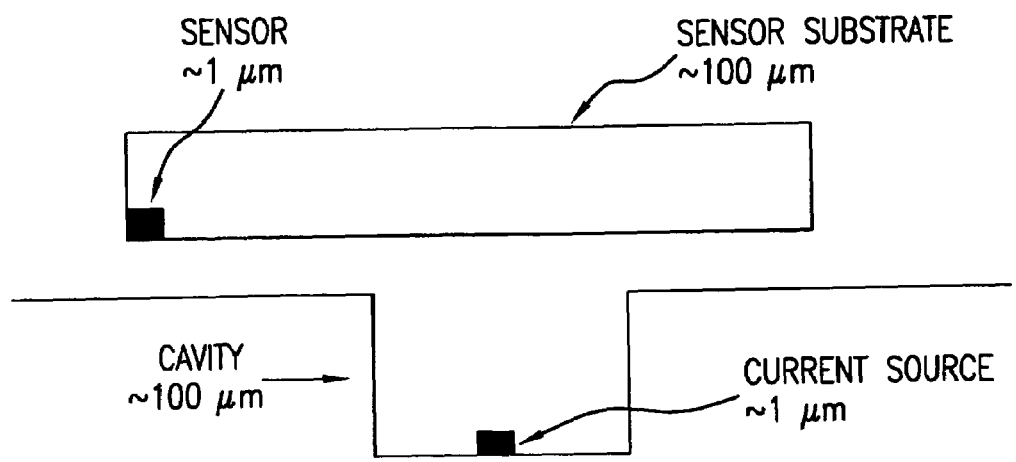
FIG. 1 schematically illustrates a conventional magnetic sensor probe which is incapable of scanning cavities of integrated circuits.
Figure 2:
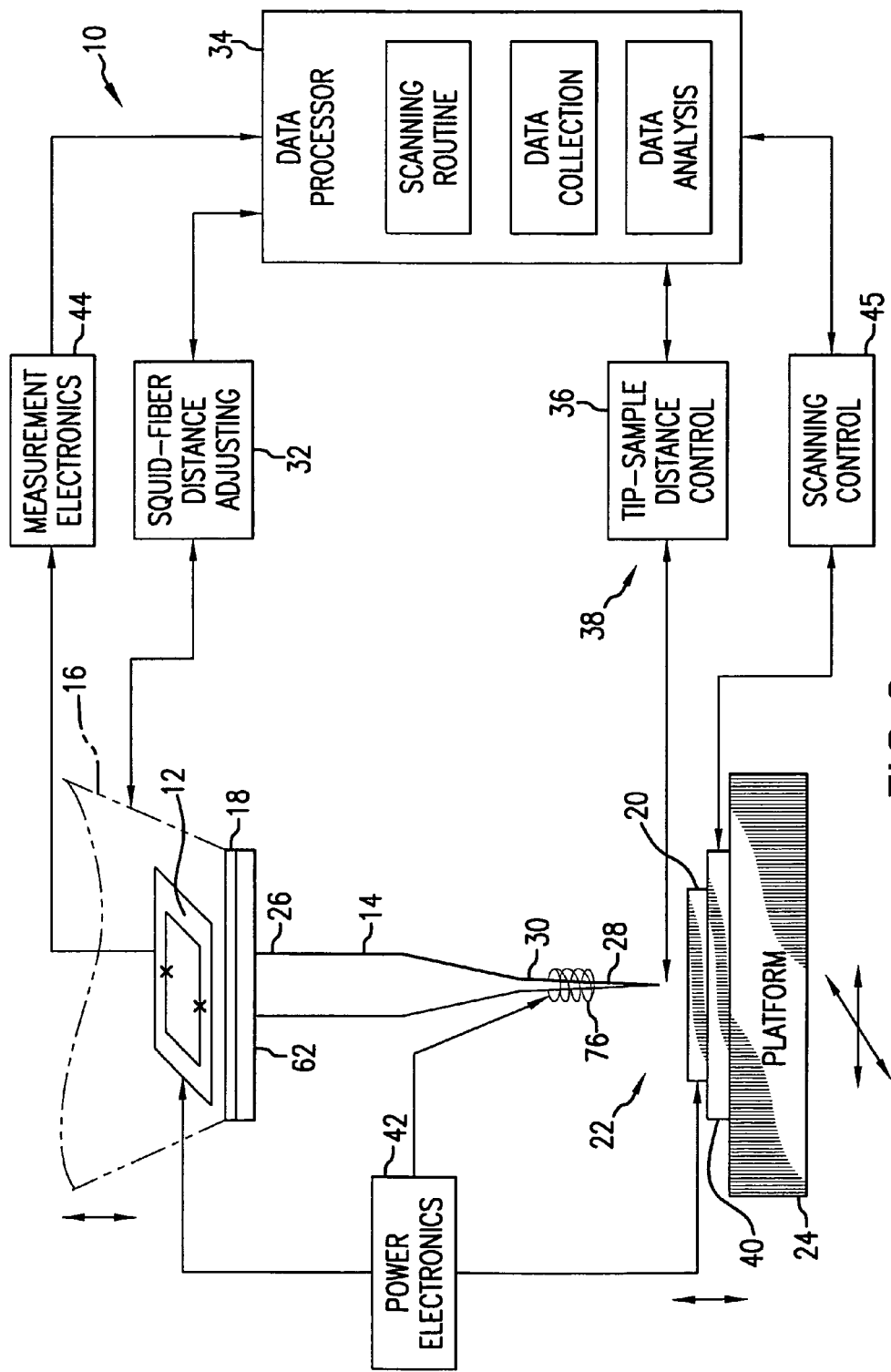
FIG. 2 is a schematic representation of the scanning SQUID microscope of the present invention.

Referring to FIG. 2, the scanning magnetic microscope 10 includes a magnetic sensor 12 and a fiber probe 14 magnetically coupled to each other. The magnetic sensor 12 may be one of a number of commercially available magnetic sensors, however, in the preferred embodiment, the Superconducting Quantum Interference Device (SQUID) has been chosen due to the extraordinary sensitivity of the SQUID to magnetic fields. The SQUID 12 is enveloped in a housing 16 where a vacuum or a cryogenic (liquid nitrogen) atmosphere at 77K is maintained, as is usual for SQUID operation. The housing 16 has a diamond window 18 which provides a thin transparent window of thickness approximating 10 micrometers.

A sample 20 which is the object of the non-destructive study for possible fault presence and location, is positioned in an air (non-vacuum) environment 22 at substantially room temperature. The sample 20 is positioned on a platform 24 which is capable of motion in XYZ direction.

The fiber probe 14 has a distal end 26, by which the fiber probe is magnetically coupled to the SQUID 12, and a tip 28 by which the fiber probe 14 "picks-up" the magnetic fields emanating from the sample 20 during the scanning routine of the microscope 10. The fiber probe 14 is a ferromagnetic metal probe of 100 μm in diameter and 5-10 mm in length, electrochemically etched at the proximal end 30 thereof to form a sharply defined tip 28 with sub-micron diameter. It is preferred that the radius of the tip is in the approximate range of 10 nm-1 μm. The fiber probe 14 resides entirely in the air environment 22 with the distal end 26 thereof secured to the window 18 in different fashions which will be discussed infra in the present description.

The sharply defined tip 28 of sub-micron dimensions permits the scanning microscope 10 of the present invention to ensure high resolution capabilities and permits the microscope to probe the entire surface of the substrate including the small cavities etched in the surface of the sample. Thus nanoscale microAmp level currents are imaged.

In the microscope 10 of the present invention, the SQUID sensor 12 does not serve as a sample probe and therefore it may be up to hundreds of microns in size. However, the ferromagnetic tip 28 allows for nanoscale imaging thus overcoming the resolution limitation of the standard SQUID. By using the ferromagnetic fiber probe 14 which efficiently transmits magnetic flux to the SQUID, the microscope 10 maintains excellent sensitivity even with the flux guide wire (fiber probe) 14 in the length range between 5-10 mm between the sample 20 and the SQUID 12. The remoteness of the SQUID from the sample overcomes the limitations associated with keeping the SQUID in a cryogenic environment while maintaining separation between the fiber probe 14 and the sample of less than 100 nm, preferably, in the range of 1-10 nm. The limitation in physically accessing buried and power circuits is naturally overcome by the fiber geometry of the fiber probe 14 since it has a footprint of less than 1 $\mu m^2$ and can scan near powering pads and within small area cavities on the surface of the sample 20.

The SQUID sensor is a superconducting device which relies on the magnetic sensitivity of the Josephson effect (electron tunneling) and quantum interference to detect small amounts of magnetic fields as changes in the sensor's current-voltage characteristic. Essentially the SQUID is a magnetic flux sensor which measures the sum of all magnetic field crossing the plane of its pick-up loop. Although the SQUID is a sensitive magnetometer, the sensitivity targets for the scanning SQUID microscope 10 are only met if a significant fraction of the flux from the sample 20 is actually transmitted through the fiber probe 14 to the SQUID 12. In order to attain this, the property of the material of the fiber probe 14 must allow the optimal flux transmission from the sample to the SQUID, which is accomplished by choosing the fiber probe made from ferromagnetic material with small grain sizes (amorphous metals or nanoparticles), low coercivity and high permeability, to insure high responsivity of the fiber to small fields.

Improvement in transmission and noise performance of the fiber probe 14 may be affected by thermal and/or current annealing, as well as chemical etching of the fibers to remove the surface defects of the fiber.

The use of a thin diamond window 18 to separate the SQUID and the fiber probe 14 permits the magnetic fiber 14 to be positioned within about 10 µm of the SQUID 12 thus maximizing coupling across the air/vacuum interface. The distance between the fiber probe 14 and the SQUID 12 may be adjusted by a SQUID-fiber distance adjusting mechanism 32 to maximize the magnetic response of the microscope. The distance adjusting mechanism 32 under the control of the data processor 34, adjusts the distance between the SQUID 12 and the distal end 26 of the fiber probe 14 by displacing the housing 16 in the Z direction thereby changing the relative disposition of the distal end 26 attached either directly to the window 18 or via a fiber holder.

The high magnetic spatial resolution of the microscope 10 is enabled, in combination with electrochemical etching of the amorphous magnetic fiber tip 28, by using a height control feedback technique to maintain separation between the tip 28 and the sample 20 in a nm range during scanning. The etching technique for sharply defining the tip 28 is performed to minimize the tip radius and maximize the tip taper to achieve a nanoscale response.

In the microscope 10, the adoption of the tip-sample distance control mechanism 36 to achieve the height control of the tip 28 above the sample 20, is important for nanoscale imaging since the resolution is limited to sizes larger than $\frac{1}{5}^{th}$ of the separation between the tip and the current source. To achieve optimum sensitivity and spatial resolution, it is important to control scanning height below 100 nm, preferably in the range of 1-10 nm. For out-of-contact scanning it is important to avoid damage to the sensor and sample during scanning. Different height control techniques are considered in the scope of the present invention such as shear force methods, capacitance techniques, AFM and STM techniques, etc. However, a preferred technique is the use of the shear force being used as a distance control mechanism in the microscope 10. In the shear force technique, the fiber is driven to small amplitude oscillations perpendicular to the length of the fiber with the amplitude of the oscillations being monitored during sample scanning. As the fiber tip approaches and interacts with the sample surface, the amplitude of the oscillations is damped and a feedback loop maintains constant damping by controlling tip-sample separation. This technique is very sensitive to tip-sample separation and can permit control down to 1 nm.

The fiber probe is driven by a tuning fork oscillator or piezoelectric element near an oscillation resonance frequency. Monitoring of oscillation amplitudes is accomplished by either optically shining a laser on one side of the fiber and sensing the fiber's shadow on the other side through use of a photodiode, or electrically with a quartz oscillator or piezoelectric transducer. A distance control feedback assembly 38 includes a linear piezo stage for setting tip/sample separations. The digital signal processor 34 which maintains the height feedback loop and the driving/sensing components in the distance control mechanism 36 are part of the feedback assembly.

The platform 24 is a rigid microscope platform isolated from vibration and may have an enclosure to protect the sample 20 and probe 14 from thermal gradient and air currents. The microscope 10 includes three axes of mechanical stages with resolution of 100 nm in each direction for executing large area scans, two axes piezo stage with resolution below 10 nm for small area high resolution scanning and a linear piezo stage for height control. The linear piezo stage, as well as 3-axis mechanical stage and 2-axes piezo stage may be parts of the same stage assembly 40, as shown in FIG. 2.

A power electronics 42 are necessary for powering the SQUID 12, sample 20 (power supplies, function generator), as well as sensor read-out electronics, shown in FIG. 2 as measurement electronics 44. The electronics are designed to be appropriate for frequencies between DC and 5 GHz.

The data processor 34 runs software to control scanning through scanning control unit 45, data collection, as well as analysis software. Scanning software is developed to scan in cavities and around obstacles. Routines are also developed for high speed high resolution scans using a no-feedback method based on knowledge of sample topography from previous larger area scans. Sample current densities and magnetization distributions are calculated from magnetic field data using the standard Fast Fourier Transform (FFT) technique.

In the scanning SQUID microscope 10, there are three parts of the flux transmission which are of high importance for high resolution high sensitivity current imaging. Of initial importance is the magnetic coupling between the sample 20 and the probe 28, which depends upon the geometry, magnetization direction, the main structure of the tip 28, and shielding used. Second is the transmission along the fiber 14 which is affected by the geometry (e.g., single line, double line, coaxial), permeability and magnetization direction of the bulk fiber. Third is the transmission between the fiber and pick-up loop of the SQUID which is affected by fiber geometry near the SQUID and may be determined by calculating the field at different heights above the fiber.

The ability to accurately quantify magnetic flux transmission is important to successfully optimize the fiber probe 14 in the microscope 10. The flux impinging on the fiber tip from the source (in the simplest case a current wire or magnetic dipole) is compared with the flux from this source that crosses the SQUID pickup loop after traveling through the fiber body. The z-component of field from a current wire (located at the intersection of the planes x=0 and z=0) of width w, carrying current I at location (x,z) is given by:

$$B_z^{wire}(x, z) = 10^{-7} \frac{I}{w} \ln\left[\frac{\left(x + \frac{w}{2}\right)^2 + z^2}{\left(x - \frac{w}{2}\right)^2 + z^2}\right] \quad (1)$$

If it is assumed that the primary flux picked up and transmitted by the flux-guide (located at the intersection of the planes x=0 and y=0) is in the direction of its length, the effective flux reaching the probe tip is then $$\Phi_{tip} = B_z^{wire} \cdot A_z^{eff},$$

where $$A_z^{eff}$$

is the effective pick-up area of the probe tip. This value is compared to the flux $\Phi_{SQUID}$, sensed by the SQUID, which is directly proportional to the SQUID's voltage.

In modeling calculations, the flux incident at the SQUID is $$\int_S B^{wire} \cdot dA,$$

where the integral is taken over the area of the SQUID pick-up loop and $B^{wire}$ refers only to field that is transmitted through the fiber. The flux transmission of the fiber/SQUID microscope is then defined as $T_{total}=\Phi_{SQUID}/\Phi_{tip}$. This total transmission is the product of three components, identifying three places where signal can be lost in the system:

$$T_{total} = T_{source}^{tip} \cdot T_{tip}^{fiber} \cdot T_{fiber}^{SQUID},$$

where $$T_{source}^{tip}$$

measures efficiency of pick-up by the tip, $$T_{tip}^{fiber}$$

measures transmission along the fiber, and $$T_{fiber}^{SQUID}$$

measures the closeness of coupling between the fiber and SQUID. Each component has been considered and optimized in order to achieve maximal total transmission for the microscope 10 of the present invention.

In the microscope 10 of the present invention, a sub-micron resolution in two dimensions with magnetic noise levels below 10 $\mu T/Hz^{0.5}$ could be achieved. This requirement for the microscope 10 is met by careful selection, fabrication, and processing of the ferromagnetic fibers and its pairing with an appropriate SQUID. Different soft magnetic fibers, composed of permalloy, metglas compounds, or nanoparticles, have been studied through magnetization and noise measurements to achieve maximum permeability, minimum coercivity, and minimum noise. Permalloy and Co—Si alloys are fabricated into commercially available ferromagnetic wires with high permeability, small switching fields, and low switching noise. Superparamagnetic Co nanoparticles may be deposited onto fibers and exhibit substantial permeability and zero coercivity. By treating the wires to a series of thermal anneals, current anneals, and chemical etches, the magnetic permeability, coercivity, and noise performance of the fiber is optimized. The aforementioned anneals serve to organize material and magnetic domains in the materials. The chemical etches remove surface imperfections which may strongly affect the noise characteristics of the wires.

Electrochemical etches using hydrochloric acid have been used to control tip taper and values. Tip shape and size may be determined using SEM imaging. The shape of the tip is made to conform to that found to optimize sensitivity and spatial resolution as determined by numerical modeling.

The SQUID sensor 12 used in the microscope 10 is a high-Tc SQUID for use with a ferromagnetic flux guide. The diameter of the SQUID is fabricated to be large enough to capture all the flux from the fiber probe 14. A SQUID diameter much larger than the fiber diameter would accept more magnetic noise from sources other than the fiber and also might require extra shielding to operate as will be presented infra in reference to FIG. 8A.

The coupling of the distal end 26 of the fiber probe 14 to the SQUID 12 is of great importance in the scanning SQUID microscope 10 of the present invention. There are several alternative embodiments of coupling between the fiber probe and the SQUID envisioned in the scope of the present invention. In one embodiment, shown in FIG. 2, the fiber probe 14 may be attached by the distal end 26 thereof either directly to the window 18 of the SQUID housing 16 or to the fiber holder 62, as will be presented infra in reference to FIG. 7.

Figure 3:
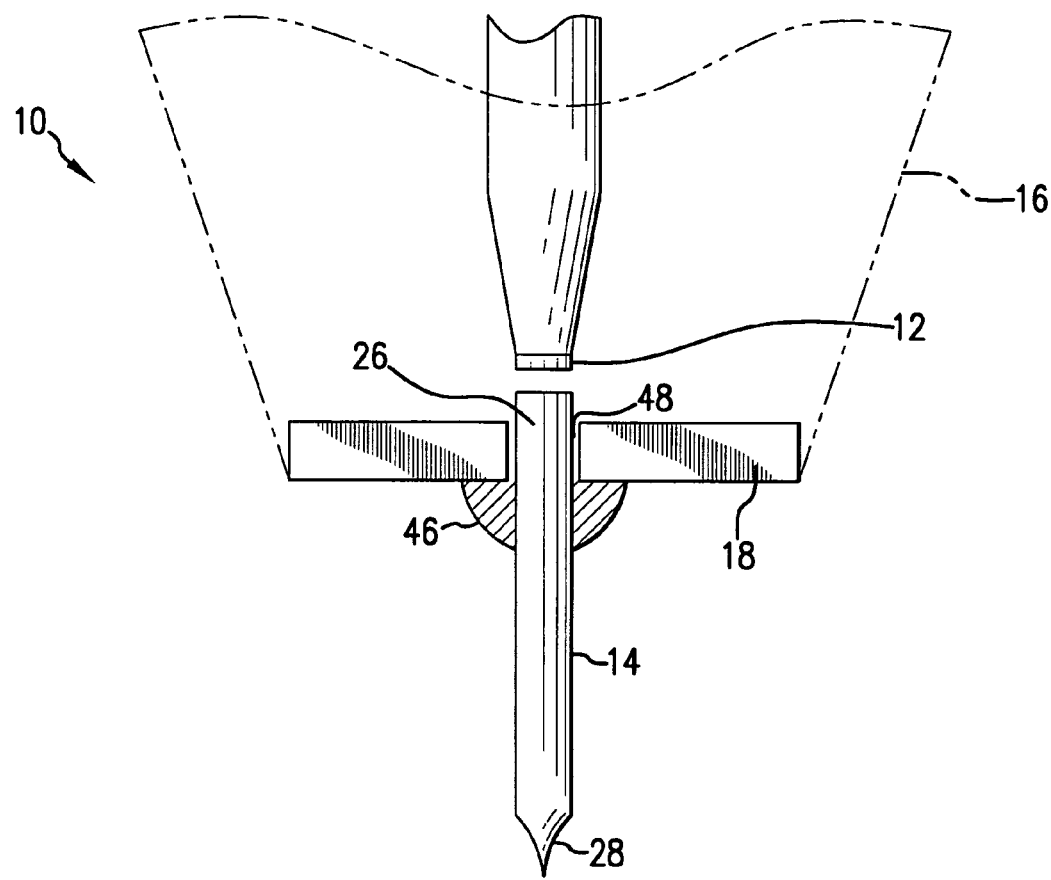
FIG. 3 schematically depicts a coupling between the fiber probe and the SQUID with the fiber probe secured to the window of the SQUID housing in an opening formed therein.

In alternative embodiments, best shown in FIG. 3, an opening 48 is formed in the window 18. The distal end 30 of the fiber probe 14 protrudes through the opening 48 and is secured, for example, by epoxy 46. In this manner, the distal portion 26 of the fiber probe 14 is extended in the vacuum environment within the SQUID housing 16 while the larger portion of the fiber probe extends into the ambient environment towards the sample 20.

Another alternative embodiment of the coupling between the fiber probe 14 and the SQUID 12 is shown in FIGS. 4A and 4B. SQUID 12 has an opening 50 formed in the substrate 52 thereof. The distal end of the fiber probe 14 protrudes through the opening 48 formed in the window and the opening 50 formed in the substrate 52 of the SQUID. The pickup coil 54 of the SQUID 12 surrounds the distal end 26 of the fiber probe 14 and picks up the magnetic flux traveling from the sample 20 to the pickup coil 54. The fiber probe 14 may be secured to the window 18 by means of epoxy 46 and can freely move in the Z direction within the opening 50 formed in the substrate 52.

Figure 5:
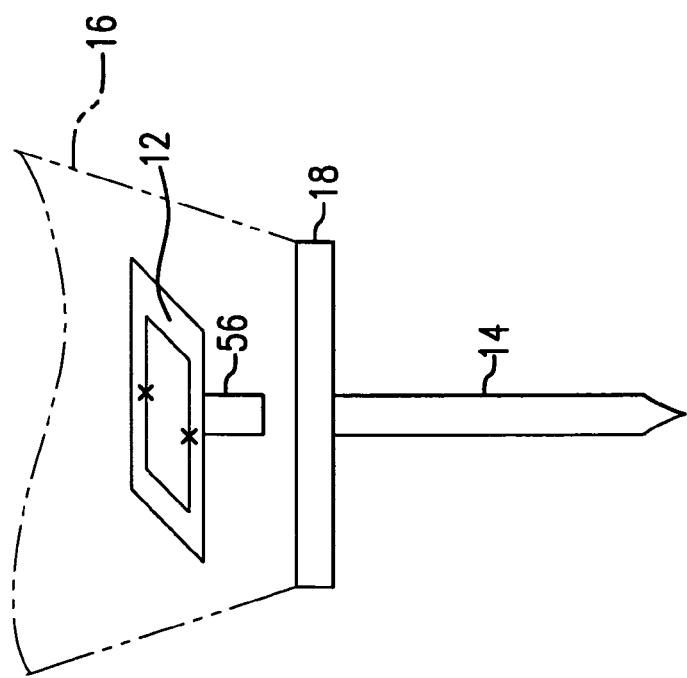
FIG. 5 schematically depicts an alternative approach of the coupling between the fiber probe and the SQUID with an integrated small fiber.

Another embodiment is shown in FIG. 5, where a small fiber 56 is integrated into the SQUID. The small fiber 56 formed of the same material as the fiber probe 14 extends into the vacuum environment of the SQUID housing 16 approximately the length of 1 mm. As shown in FIG. 5, the fiber probe 14 extends external the SQUID housing 16 and is aligned with the small fiber 56.

In the embodiments of the coupling between the SQUID and the fiber probe presented in FIGS. 2 and 3, the distance adjusting mechanism 32 under the control of the data processor 34 adjusts the distance between the distal end 26 and the SQUID 12 by moving the housing 16 in the Z direction. In the same manner, by moving the housing 16 in the Z direction, the extent of protrusion of the fiber probe into the opening 50 (for the embodiment shown in FIGS. 4A and 4B) and the distance between the fiber probe 14 and the small fiber 56 (for the embodiment shown in FIG. 5), can be controlled.

Figure 6:
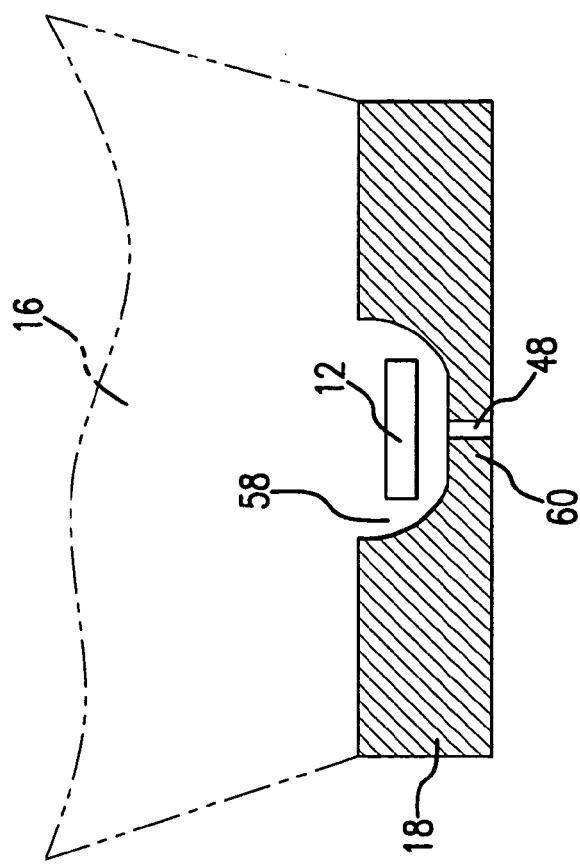
FIG. 6 is a schematic representation of a window of the SQUID housing patterned to form a recess in a central region where the SQUID is positioned.

Additional control of the coupling between the SQUID and the fiber probe may be achieved through patterning of the diamond window 18 as shown in FIG. 6. In this fashion the window 18 is patterned to form a recess 58 in the center thereof where the SQUID 12 is positioned. The distance between the SQUID and the fiber probe 14 may be reduced approximately to the width of the window material remaining in the central area of the window. This narrow central area 60 underlying the recess 58 may be left untreated for the SQUID-fiber coupling presented in FIGS. 2 and 5. Alternatively, a small opening 48 may be formed in the central area 60 of the window 18 for the embodiments shown in FIG. 3 and FIGS. 4A and 4B in order that the distal end 26 of the fiber probe 14 may extend therethrough to attain even closer coupling between the SQUID and the fiber probe 14.

Figure 7:
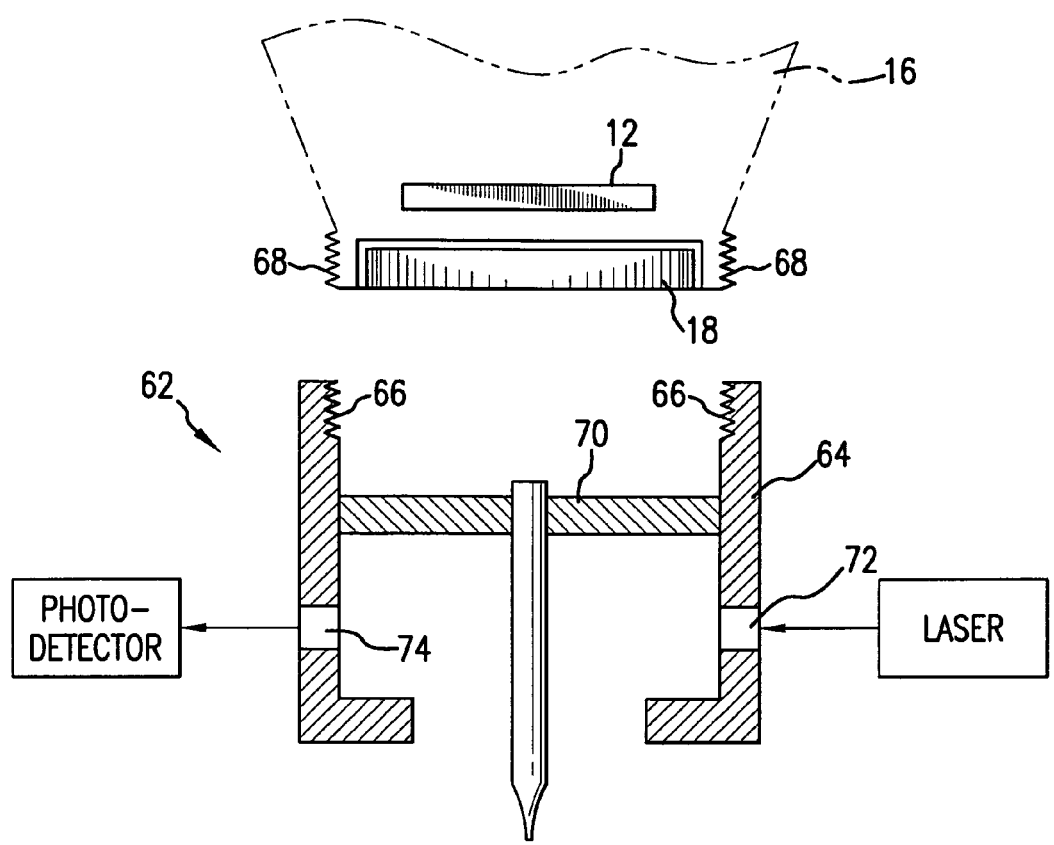
FIG. 7 is a schematic representation of the SQUID housing and the fiber probe holder attached thereto.

For easy replacement of the fiber probe 14, a fiber holder 62 shown in FIG. 7 has been fabricated. The fiber holder has walls 64 with threaded surfaces 66 on the upper edge thereof for threaded engagement with mating threaded surfaces 68 of the SQUID housing 16. This concept is schematically shown in FIG. 7. The fiber probe 14 is integrated into the member 70 of the fiber holder 62. The member 70 is formed of transparent plastic, quartz, or lexane and is aligned with the window 18 of the SQUID housing 16. The walls 64 of the fiber holder 62 may have openings 72 and 74. These openings 72 and 74 are provided to facilitate the performance of a shear force distance control by permitting the laser beam into the opening 72 and positioning the photo-diode at the opening 74 for sensing the changes in the fiber's oscillations.

The fiber holder 62 approach for the scanning SQUID microscope 10 of the present invention facilitates the ease of addition or subtraction of the fiber probes 14 to or from the SQUID sensor. The ease of manipulation allows two modes of operation thereof, e.g., measurements with bare SQUID, and measurements through the fiber probe 14 to be quickly made. In this manner, two types of scans can be taken using the same microscope 10. Scanning with spatial resolution of near 50 micrometers using the bare SQUID for maximal magnetic sensitivity (near 1 $pT/Hz^{0.5}$) may be made as well as scans with magnetic sensitivity near 10 $nT/Hz^{0.5}$ using the fiber for the optimal spatial resolution. Using the fiber holder 62, the fiber mounting does not require breaking vacuum in the SQUID chamber 16, but allows positioning of the fiber within 20 μm of the SQUID.

A number of scanning routines have been developed for the microscope 10. One key issue is that the SQUID 12 accepts magnetic signal directly from the sample as well as through the fiber probe 14. One possible solution is to scan each line (or each point) at two heights, one close (z<50 nm) and one far (z>50 μm). Subtracting the far scan data from the near scan data serves to subtract the background contribution of field reaching the SQUID directly.

Other important scanning routines include calibration of the field response (to measure absolute current and field values) and field biasing of the flux-guide into its highest permeability, lowest noise region in order to maximize sensitivity. The field biasing method may either use a constant dc bias (for low field sources) or an active feedback method (for higher field sources). Field biasing of the flux-guide may also be used to realize a chopping mode to make measurements of dc fluxes with ac techniques. In this method, a coil is energized with an ac current to sweep the flux-guide between high and low permeability regions during a dc scan. As shown in FIG. 2, for the field biasing method, a coil 76 is integrated with the tip 28 of the fiber probe 14. The coil 76 is energized with an AC current, preferably from the power electronics 42, shown in FIG. 2, to bias the fiber probe into its highest permeability, lowest noise region, in order to maximize sensitivity of the measurements.

One software solution specific to the fiber/SQUID approach is a routine for subtracting the magnetic field background directly from the sample. Assuming these background fields have large wavelengths relative to the scan area, they may be subtracted from the raw data.

To protect the microscope from electromagnetic interference, shielding may be added to different parts of the measurement scheme. For example, as shown in FIG. 8A, a μ-metal box 78 is positioned in the housing 16 to shield the SQUID sensor, with a hole for the distal end of the fiber probe 14.

In another embodiment shown in FIG. 8B, the μ-metal tube 80 surrounds the fiber probe 14 and extends from the SQUID housing 16 to the tip 28 of the fiber probe 14. As shown in FIG. 8C, a μ-metal sheath 82 surrounds the fiber probe 14 and extends along the length of the fiber probe to the tip 28. The shieldings to either the SQUID and/or the fiber probe may significantly increase the magnetic sensitivity of the microscope and additionally reduce the measurement noises by cutting off the signal other than the signal of interest which may reach the SQUID sensor directly from the surrounding environment or which may couple to portions of the fiber probe above the tip. By placing the shield 78 around the SQUID, and the shield 80 and/or 82 around the fiber probe, the extraneous unwanted signals are blocked from getting to the SQUID sensor 12. The only signal which is transmitted to the SQUID sensor is the signal picked up by the tip 28 from the sample 20.

Initial scans with the scanning SQUID microscope 10 of the present invention have been performed on small current structures with multiple well-defined features. It has been demonstrated that current lines 10 micrometer apart can be distinguished. The edge resolution for these current lines is approximately 1 micrometer with significant gradients of magnetic field measured across this distance.

Figure 9B:
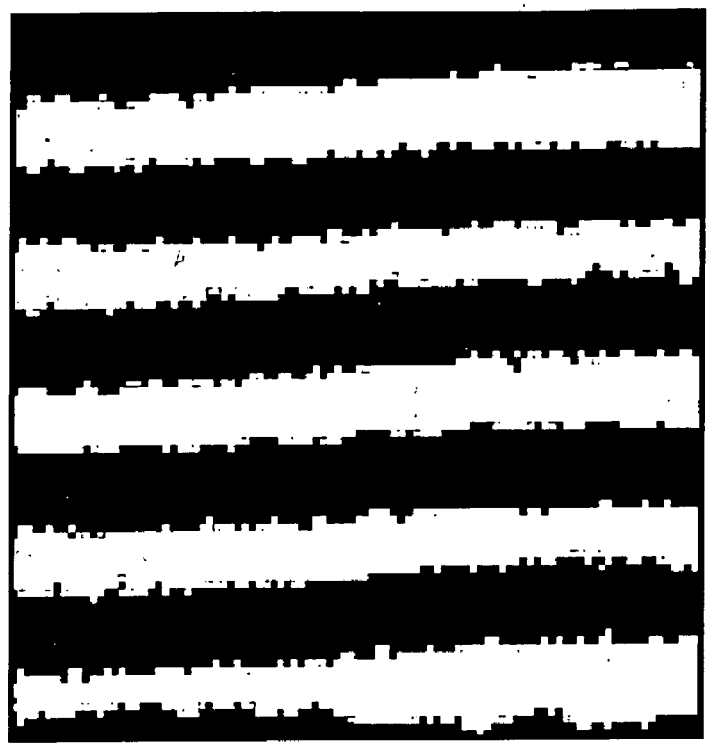
FIG. 9B illustrates a Fast Fourier Transform (FFT) current inverse of the magnetic field image exhibiting the presence of 5 current lines about 10 μm wide and separated by 10 μm.
Figure 9A:
FIG. 9A is an image of a serpentine taken with the fiber/SQUID microscope of the present invention.

FIG. 9A is an image of a serpentine taken with the microscope 10 of the present invention. The current lines are approximately 10 micrometers wide and 10 micrometers apart. The peak-to-peak current applied was 3 mA at approximately 10 KHz. FIG. 9B is a Fast Fourier Transform (FFT) current inverse of the magnetic field image, exhibiting the presence of 5 current lines about 10 micrometers wide each separated by 10 micrometers.

The Scanning SQUID Microscope (SSM) 10 with the fiber probe 14, has excellent potential for locating die level defects and may play a complementary role to standard scanning SQUID microscopes with a bare SQUID. The microscope of the present invention has the potential to detect sub-micron anomalies in magnetic fields created by current defects as long as the fiber probe is brought within a few microns of the current line. The microscope may be used for wafer level studies or examination of deprocessed samples.

In the scanning SQUID microscope 10 of the present invention, the barriers of the standard SQUID microscopes are overcome by making a dramatic change to a fiber-based geometry probe while maintaining the high sensitivity achievable with the SQUID sensors. In addition to enabling high sensitivity nanoscale imaging of buried currents, this instrument has unmatched versatility in locating and localizing defects. High speed high area scans with height control feedback can be used to inspect entire devices or wafers to find abnormalities that indicate the presence of a defect, even through millimeters of metal or insulator with no deprocessing of the sample. Once the instrument localizes the defect in this mode (with a resolution of about $\frac{1}{5}^{th}$ of the sensor/current separation), the sample can then be minimally deprocessed to create a cavity for insertion of the fiber probe. The same instrument accomplishes nanoscale location and characterization of the defect through the cavity.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular locations of elements may be reversed, or interposed, all without departing from the spirit or scope of the invention as defined in the appended Claims.

What is claimed is:

1. A system for high resolution current imaging by direct magnetic field sensing, comprising:
    a sample positioned in an ambient environment;
    a magnetic sensor positioned in an enclosure separating said magnetic sensor from said ambient environment, said enclosure having a window;
    a fiber probe having a proximal end and a distal end, said proximal end having a sharply defined tip having a radius in the range of approximately 10 nm -1 µm, said fiber probe being secured by said distal end thereof to said window, said fiber probe being magnetically coupled by said tip to said sample and by said distal end thereof to said magnetic sensor to transmit thereto a signal corresponding to a magnetic field emanating from said sample;
    a distance controlling mechanism actively controlling a distance between said sample and said tip of said fiber probe and maintaining said distance in the range of approximately 1-100 nm, and
    a coil attached to or in proximity to said tip of said fiber probe in surrounding relationship therewith to DC-bias said fiber probe to the point of the highest permeability thereof.

2. The system of claim 1, wherein said magnetic sensor is a Superconducting Quantum Interference Device (SQUID).

3. The system of claim 2, wherein said SQUID includes a pickup coil formed on a substrate, said distal end of said fiber probe protruding through a hole formed in said substrate substantially at a symmetrical center of said pickup coil of said SQUID.

4. The system of claim 1, wherein said enclosure includes a housing having said window for separating said magnetic sensor from said ambient environment, said ambient environment being a non-vacuum environment.

5. The system of claim 4, wherein said magnetic sensor is maintained in a vacuum environment enveloped by said housing.

6. The system of claim 4, wherein said magnetic sensor is maintained in a cryogenic environment enveloped by said housing.

7. The system of claim 1, wherein said distal end of said fiber probe is pressed into contact against said window.

8. The system of claim 1, wherein said window has an opening formed therein, said distal end of said fiber probe protruding through said opening.

9. The system of claim 1, further comprising a fiber integrated into said magnetic sensor and extending therefrom towards said window in substantial alignment with said distal end of said fiber probe.

10. The system of claim 1, wherein said window is patterned to form a recess therein, said magnetic sensor being positioned in said recess of said window.

11. The system of claim 1, wherein the distance between said distal end of said fiber probe and said magnetic sensor is maintained in the range of approximately 0-1 µm.

12. The system of claim 1, wherein said distance controlling mechanism includes a shear force feedback mechanism.

13. The system of claim 1, wherein said fiber probe has a length in the range of approximately 1-10mm.

14. The system of claim 1, wherein said fiber probe is made of a ferromagnetic material of high permeability.

15. The system of claim 14, wherein said fiber probe is made from permalloy.

16. The system of claim 14, wherein said fiber probe is made from a metglas alloy.

17. The system of claim 14, wherein said fiber probe is made from a material subjected to magnetic or current annealing.

18. The system of claim 14, wherein said fiber probe is made of a material subjected to temperature annealing.

19. The system of claim 14, wherein said fiber probe is made of material subjected to the surface etching to remove surface imperfections therefrom.

20. The system of claim 1, wherein said window is a diamond window.

21. The system of claim 1, wherein said tip of said fiber probe is a finely polished tip.

22. The system of claim 1, further comprising, an electromagnetic shielding for said magnetic sensor.

23. The system of claim 1, further comprising a shielding surrounding said fiber probe along the length thereof.

24. A system for high resolution current imaging by direct magnetic field sensing, comprising:

a sample positioned in an ambient environment;

a magnetic sensor positioned in a housing separating said magnetic sensor from said ambient environment;

a fiber probe having a proximal end and a distal end, said proximal end having a sharply defined tip having a radius in the range of approximately 10 nm -1 µm, said fiber probe being magnetically coupled by said tip to said sample and by said distal end thereof to said magnetic sensor to transmit thereto a signal corresponding to a magnetic field emanating from said sample;

a distance controlling mechanism actively controlling a distance between said sample and said tip of said fiber probe and maintaining said distance in the range of approximately 1 -100 nm;

a fiber holder, said fiber probe being integrated in said fiber holder; and an attachment mechanism for attachment of said fiber holder to said housing, said attachment mechanism including mating threaded surfaces on said housing and said fiber holder respectively, wherein said housing maintains a non-ambient environment when said fiber holder is displaced therefrom.

25. A method for high resolution current imaging by direct magnetic field sensing, comprising the steps of:

providing a magnetic microscope comprising a magnetic sensor and a fiber probe magnetically coupled by a distal end thereof to said magnetic sensor, said fiber probe further having a sharply defined tip formed at a proximal end thereof opposite to said distal end, said tip having a radius in the range of approximately 10 nm 1 µm, installing a sample in an ambient environment, positioning said magnetic sensor in a vacuum environment, surrounding said vacuum environment by a housing containing a window, integrating said fiber probe into a fiber holder, removably securing said fiber holder to said housing, thereby securing said distal end of said fiber probe to said window, magnetically coupling said tip of said fiber probe of said magnetic microscope to said sample, controlling a distance between said tip of said fiber probe and said sample to maintain said distance in the range approximately 1-100 nm, changing relative disposition between said magnetic microscope and said sample to probe magnetic fields emanating from said sample by said tip of said fiber probe, removing said fiber holder from said housing, measuring magnetic fields emanating from said sample with a bare said magnetic sensor;

attaching said fiber holder to said housing; and measuring the magnetic fields emanating from said sample through said fiber probe.

26. The method of claim 25, further comprising the step of:

establishing a cryogenic temperature in said vacuum environment surrounding said magnetic sensor.

27. The method of claim 25, further comprising the steps of:

optimizing the transmission characteristics of said fiber probe.

28. The method of claim 27, further comprising the step of:

forming said fiber probe from a ferromagnetic metal of high permeability.

29. The method of claim 27, further comprising the step of:

magnetic, current or thermal annealing said fiber probe.

30. The method of claim 27, further comprising the step of:

surface etching said fiber probe.

31. The method of claim 25, further comprising the step of:

etching said tip of said fiber probe to attain said radius of said tip in said range.

32. The method of claim 25, further comprising the steps of:

processing data corresponding to magnetic flux detected by said magnetic sensor, transforming said data into current values, and displaying said current values.

33. The method of claim 25, further comprising the step of:

maintaining a distance between said distal end of said fiber probe and said magnetic sensor in the range of approximately 0-1 µm.

34. The method of claim 25, further comprising the steps of:

patterning said window to form a central recess therein; and positioning said magnetic sensor in said recess.

35. The method of claim 25, further comprising the steps of:

forming a central opening in said window, and protruding said distal end of said fiber probe through said opening.

36. The method of claim 35, wherein said sensor includes a substrate and a pickup coil, further comprising the steps of:

forming a hole in said substrate, and protruding said distal end of said fiber probe through said hole in said substrate and in said pickup coil.

37. The method of claim 25, further comprising the steps of:

integrating a fiber into said magnetic sensor, said fiber extending towards said window in said vacuum environment, and aligning said fiber with said distal end of said fiber probe positioned outside said window in said ambient environment.

38. The method of claim 25, further comprising the step of:

surrounding said fiber probe with a shielding member extending coaxially to said fiber probe along the length thereof.

39. The method of claim 25, further comprising the step of:

surrounding said magnetic sensor with an electromagnetic shield.

40. The method of claim 25, wherein said magnetic sensor is a Superconducting Quantum Interference Device (SQUID).

* * * * *